(12) United States Patent
Wang et al.

(10) Patent No.: US 11,903,279 B2
(45) Date of Patent: Feb. 13, 2024

(54) DISPLAY SUBSTRATE INCLUDING FIRST REFERENCE VOLTAGE LINE BEING ELECTRICALLY COUPLED TO FIRST REFERENCE VOLTAGE AUXILIARY LINE THROUGH VIA HOLES PENETRATING THROUGH INSULATION LAYER THEREBETWEEN, AND DISPLAY DEVICE HAVING THE SAME

(71) Applicant: BOE Technology Group Co., Ltd., Beijing (CN)

(72) Inventors: Li Wang, Beijing (CN); Libin Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/844,305

(22) Filed: Jun. 20, 2022

(65) Prior Publication Data
US 2022/0336572 A1 Oct. 20, 2022

Related U.S. Application Data

(63) Continuation of application No. 17/038,305, filed on Sep. 30, 2020, now Pat. No. 11,569,334.

(30) Foreign Application Priority Data

Dec. 20, 2019 (CN) .......................... 201922312490.X

(51) Int. Cl.
H01L 29/08 (2006.01)
H10K 59/131 (2023.01)
H10K 59/121 (2023.01)

(52) U.S. Cl.
CPC ....... *H10K 59/131* (2023.02); *H10K 59/1213* (2023.02); *H10K 59/1216* (2023.02); *H10K 59/1315* (2023.02)

(58) Field of Classification Search
CPC ............. H10K 59/131; H10K 59/1213; H10K 59/1216; H10K 59/1315
(Continued)

(56) References Cited

U.S. PATENT DOCUMENTS

2003/0116768 A1 6/2003 Ishikawa
2015/0028293 A1 1/2015 Jung
(Continued)

*Primary Examiner* — Phuc T Dang
(74) *Attorney, Agent, or Firm* — Nath, Goldberg & Meyer; Joshua B. Goldberg

(57) ABSTRACT

There is provided a display substrate, in which, a first reference voltage line and a first reference voltage auxiliary line, which extend in different directions, are respectively disposed in one of a second wiring layer, a third wiring layer and a fourth wiring layer, a second reference voltage line extends in the same direction as the first reference voltage auxiliary line, the first reference voltage auxiliary line is electrically coupled to the first reference voltage line through via holes in an insulating layer therebetween, via a coupling line extending in the same direction as the first reference voltage line, the first reference voltage auxiliary line and the first reference voltage line provide a reset voltage to a first electrode of a first capacitor, and the second reference voltage line provides a reset voltage to a pixel electrode in a pixel electrode layer. A display device is further provided.

20 Claims, 12 Drawing Sheets

(58) Field of Classification Search
USPC .......................................................... 257/40
See application file for complete search history.

(56) References Cited

U.S. PATENT DOCUMENTS

| | | | |
|---|---|---|---|
| 2015/0161940 A1* | 6/2015 | Woo | G09G 3/325 |
| | | | 345/58 |
| 2017/0062545 A1 | 3/2017 | Oh et al. | |
| 2017/0243898 A1 | 8/2017 | Kim | |
| 2017/0322471 A1 | 11/2017 | Jeong et al. | |
| 2019/0197950 A1* | 6/2019 | Shibusawa | H10K 59/131 |
| 2020/0144522 A1* | 5/2020 | Jung | H10K 59/122 |

\* cited by examiner

DISPLAY SUBSTRATE INCLUDING FIRST REFERENCE VOLTAGE LINE BEING ELECTRICALLY COUPLED TO FIRST REFERENCE VOLTAGE AUXILIARY LINE THROUGH VIA HOLES PENETRATING THROUGH INSULATION LAYER THEREBETWEEN, AND DISPLAY DEVICE HAVING THE SAME

CROSS-REFERENCE TO RELATED APPLICATIONS

The present application is a Continuation of U.S. patent application Ser. No. 17/038,305, filed on Sep. 30, 2020, and issued on Jan. 31, 2023, as U.S. Pat. No. 11,569,334, and claims the priority of Chinese Patent Application No. 201922312490.X, filed on Dec. 20, 2019, and the contents of the U.S. Patent Application and the Chinese Patent Application are incorporated herein in their entirety by reference.

TECHNICAL FIELD

The present disclosure relates to the field of display technology, and more particularly, to a display substrate and a display device.

BACKGROUND

In the related art, a pixel circuit of an organic light emitting diode display substrate may be provided with two reference voltage input terminals, and independent reference voltages need to be applied to the two reference voltage input terminals respectively. Correspondingly, two reference voltage lines are needed to be provided for the pixel circuit in the display substrate. The two reference voltage lines generally have different degrees of influence on the pixel circuit, and thus, for the reference voltage line having a greater influence on the pixel circuit, stability and uniformity of a voltage thereof and a self-resistance thereof become important indexes paid attention by those skilled in the art.

In the related art, reference voltage auxiliary lines are disposed in gaps between pixel electrodes of the organic light emitting diode display substrate, and the reference voltage auxiliary lines in the gaps between the pixel electrodes are electrically coupled to the reference voltage lines through via holes, thereby reducing resistances of the reference voltage lines.

Since the reference voltage auxiliary lines are disposed in the gaps between the pixel electrodes, an aperture ratio of display is affected.

SUMMARY

According to a first aspect of the present disclosure, there is provided a display substrate, which includes a base substrate, and a first wiring layer, a second wiring layer, a third wiring layer, a fourth wiring layer and a pixel electrode layer successively away from the base substrate, an insulating layer is disposed between any adjacent ones of the first wiring layer, the second wiring layer, the third wiring layer, the fourth wiring layer and the pixel electrode layer, a reset control line and a light emitting control line, which each extend in a row direction, are disposed in the first wiring layer, the display substrate further includes a first reference voltage line, a second reference voltage line, and a first reference voltage auxiliary line, the first reference voltage line and the first reference voltage auxiliary line are respectively disposed in one of the second wiring layer, the third wiring layer, and the fourth wiring layer, the first reference voltage line and the first reference voltage auxiliary line extend in different directions, the second reference voltage line and the first reference voltage auxiliary line extend in a same direction, the first reference voltage auxiliary line is electrically coupled to the first reference voltage line through a plurality of via holes penetrating through the insulating layer between a layer where the first reference voltage auxiliary line is disposed and a layer where the first reference voltage line is disposed, via a coupling line extending in the same direction as the first reference voltage line, the display substrate further includes a first capacitor, the first reference voltage auxiliary line and the first reference voltage line are configured to provide a reset voltage to a first electrode of the first capacitor, and the second reference voltage line is configured to provide a reset voltage to a pixel electrode in the pixel electrode layer.

In some embodiments, the first reference voltage auxiliary line and the coupling line are disposed in a same layer, and orthographic projections of the coupling line and the first reference voltage line on the base substrate partially overlap with each other.

In some embodiments, adjacent coupling lines between adjacent first reference voltage auxiliary lines are arranged at intervals in the direction in which the coupling line extends, and are passed through by a same line extending in the same direction as the coupling line, and a power supply line is arranged between the adjacent coupling lines and in the same layer as the coupling lines, and a direction in which the power supply line extends intersects with the direction in which the coupling line extends.

In some embodiments, the first reference voltage line extends in the row direction, and is disposed in the second wiring layer, and the first reference voltage auxiliary line extends in a column direction, and is disposed in the fourth wiring layer.

In some embodiments, the display substrate further includes: a power supply structure, and a power supply auxiliary line disposed in the second wiring layer and extending in the row direction, the power supply structure is electrically coupled to the power supply auxiliary line through a plurality of via holes penetrating through the insulating layer between the second wiring layer and a layer where the power supply structure is disposed.

In some embodiments, the display substrate further includes: a power supply line disposed on a side of the power supply structure away from the base substrate and extending in the column direction, and the power supply structure is electrically coupled to the power supply line through a plurality of via holes penetrating through the insulating layer between the layer where the power supply structure is disposed and a layer where the power supply line is disposed.

In some embodiments, orthographic projections of the power supply structure and the power supply line on the base substrate overlap with each other.

In some embodiments, the display substrate further includes: data lines each extending in the column direction and pixel circuits arranged in the row direction and the column direction, where the pixel circuits in each row are correspondingly and electrically coupled to a gate line, the reset control line and the light emitting control line, and the pixel circuits in each column are correspondingly and electrically coupled to one data line and one power supply line.

In some embodiments, the pixel circuits adjacent to each other in a same row are symmetrically arranged with respect to an axis of symmetry extending in the column direction.

In some embodiments, the data lines to which the pixel circuits adjacent to each other in the same row are electrically coupled are symmetrically disposed with respect to an axis of symmetry extending in the column direction, and power supply lines to which the pixel circuits adjacent to each other in the same row are electrically coupled are symmetrically disposed with respect to an axis of symmetry extending in the column direction.

In some embodiments, the pixel circuits adjacent to each other in the same row share the power supply structure.

In some embodiments, the pixel circuits adjacent to each other in the same row are coupled together by respective active layers thereof.

In some embodiments, each pixel circuit includes a compensation transistor and a driving transistor, and a first electrode of the compensation transistor and a gate electrode of the driving transistor are coupled together through a first connection block disposed on a side of the second wiring layer away from the base substrate.

In some embodiments, first connection blocks of the pixel circuits adjacent to each other in the same row are symmetrically arranged with respect to an axis of symmetry extending in the column direction.

In some embodiments, each pixel circuit includes a reset control transistor, and the first reference voltage line is coupled to a second electrode of the reset control transistor through a second connection block disposed on a side of the second wiring layer away from the base substrate and extending in the column direction.

In some embodiments, each pixel circuit includes a data writing transistor, and parts of data writing transistors of the pixel circuits adjacent to each other in the same row in an active layer, include portions extending towards each other in the row direction, and the portions extending towards each other in the row direction are electrically coupled to the data lines through via holes, respectively.

In some embodiments, each pixel circuit includes a reset transistor, and orthographic projections of an active layer of the reset transistor and the reset control line on the base substrate overlap with each other at two positions, so that the reset transistor is in a double-gate structure.

In some embodiments, each pixel circuit includes a light emitting device, an electrode of the light emitting device is the pixel electrode in the pixel electrode layer, orthographic projections of the pixel electrode and the first reference voltage auxiliary line on the base substrate partially overlap with each other, and an orthographic projection of a bisector of the pixel electrode in the row direction on the base substrate at least partially overlaps with an orthographic projection of the first reference voltage auxiliary line on the base substrate.

In some embodiments, each pixel circuit includes a light emitting device, an electrode of the light emitting device is the pixel electrode in the pixel electrode layer, and an orthogonal projection of the pixel electrode on the base substrate at least partially overlaps orthogonal projections of two adjacent power supply lines on the base substrate.

According to a second aspect of the present disclosure, there is provided a display device, which includes the display substrate described above.

DESCRIPTION OF EMBODIMENTS

Figure 1:
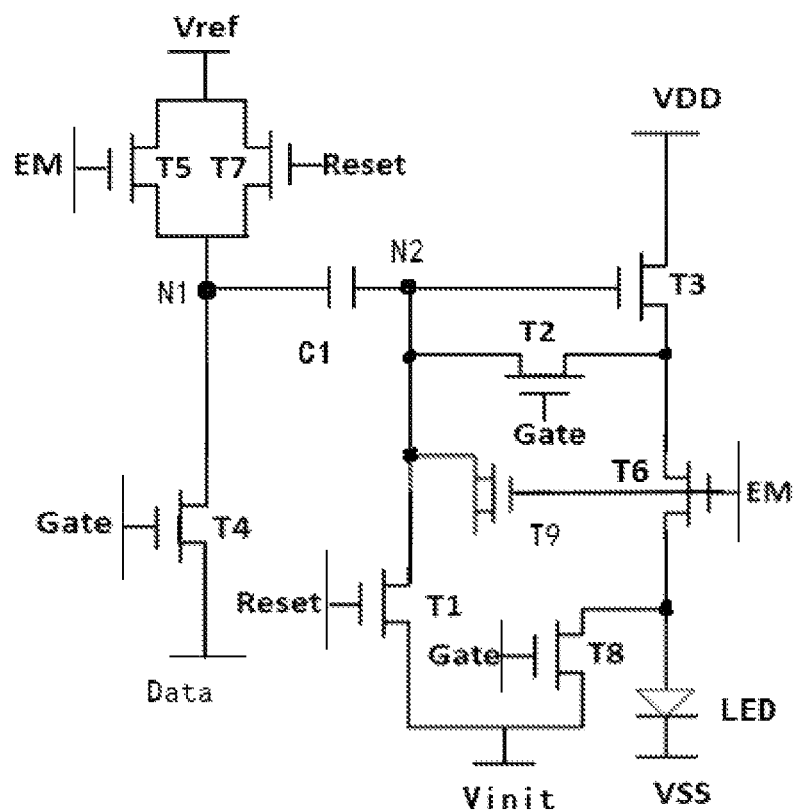
FIG. 1 is a circuit diagram of a pixel circuit in a display substrate according to an embodiment of the present disclosure.

In order that those skilled in the art will better understand the technical solutions of the present disclosure, the following detailed description is given with reference to the accompanying drawings and the specific embodiments.

In the present disclosure, two structures being arranged "in a single layer" means that the two structures are formed from a same material layer, and thus are in a same layer in a stacking relationship, but does not mean that they are equidistant from the base substrate, nor that other layer structures between one of the two structures and the base substrate are completely identical to other layer structures between the other one of the two structures and the base substrate.

Referring to FIGS. 1 to 6h, an embodiment of the present disclosure provides a display substrate, including a base substrate 1, and a first wiring layer 5, a second wiring layer 7, a third wiring layer 9, a fourth wiring layer 11, and a pixel electrode layer 13 successively away from the base substrate 1, where an insulating layer is disposed between any adjacent ones of the first wiring layer 5, the second wiring layer 7, the third wiring layer 9, the fourth wiring layer 11, and the pixel electrode layer 13, and a gate line Gate, a reset control line Reset, and a light emitting control line EM extending in a row direction are disposed in the first wiring layer 5; the display substrate further includes a first reference voltage line Vref, a second reference voltage line Vinit, and a first reference voltage auxiliary line Vref0, the first reference voltage line Vref, the second reference voltage line Vinit, and the first reference voltage auxiliary line Vref0 are respectively disposed in one of the second wiring layer 7, the third wiring layer 9, and the fourth wiring layer 11, the first reference voltage line Vref is electrically coupled to the first reference voltage auxiliary line Vref0 through via holes H penetrating through the insulating layer therebetween, the first reference voltage line Vref and the first reference voltage auxiliary line Vref0 extend in different directions, the second reference voltage line Vinit and the first reference voltage auxiliary line Vref0 extend in a same direction, the first reference voltage line extends in a row or column direction, and the second reference voltage line Vinit extends in the row direction or column direction.

In the present disclosure, the row direction and the column direction only indicate two intersecting directions, and are not limited to be perpendicular to each other, and are independent of a current viewing angle of a viewer.

The lines in the first wiring layer 5 to the fourth wiring layer 11 may supply driving signals to the pixel circuit provided on the base substrate 1. The pixel electrode layer 13 is provided with a pixel electrode P. The pixel electrode P may participate in constituting a sub-pixel (e.g., an organic light emitting diode).

One or more transistors, such as a top gate type thin film transistor or a bottom gate type thin film transistor, may be provided in the pixel circuit.

Taking the transistor being a top gate type thin film transistor as an example, an active layer 3 of the transistor is closer to the base substrate 1 than the gate (usually multiplexed by a segment of the gate line Gate in the first wiring layer 5) of the transistor.

Figure 5:
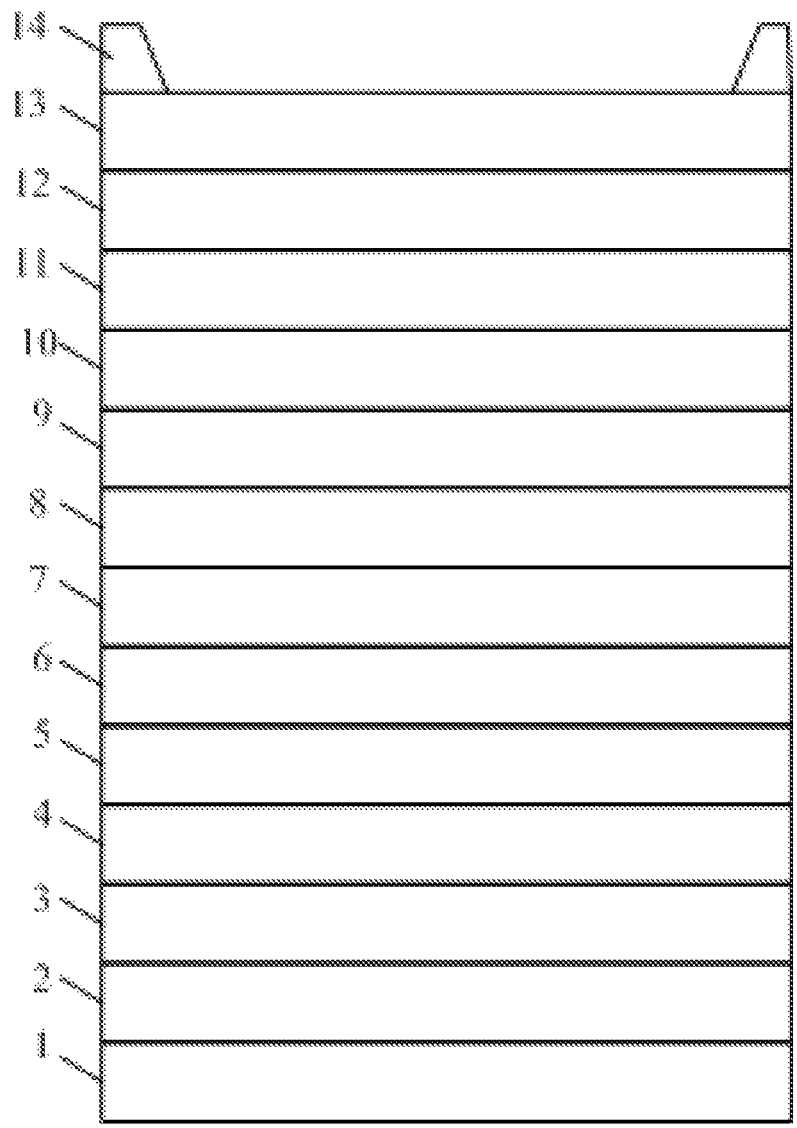
FIG. 5 is a schematic diagram illustrating a stacking relationship of different structures in a display substrate according to an embodiment of the present disclosure.

In these embodiments, referring to FIG. 5, a gate insulating layer 4 is interposed between the active layer 3 and the first wiring layer 5, a first insulating layer 6 (also referred to as an interlayer insulating layer) is interposed between the first wiring layer 5 and the second wiring layer 7, a second insulating layer 8 (also referred to as an interlayer insulating layer) is interposed between the second wiring layer 7 and the third wiring layer 9, a third insulating layer 10 (also referred to as an interlayer insulating layer) is interposed between the third wiring layer 9 and the fourth wiring layer 11, and a planarization layer 12 is interposed between the fourth wiring layer 11 and the pixel electrode layer 13. The planarization layer 12 provides a flat bottom surface for the pixel electrode P.

A pixel defining layer 14 is further disposed on a side of the pixel electrode layer 13 facing away from the base substrate 1, and an organic light emitting layer may be formed in a pixel groove formed by the pixel defining layer 14, so as to define a light emitting region of the organic light emitting diode.

Certainly, a buffer layer 2 may further be provided between the base substrate 1 and the active layer 3.

Figure 3:
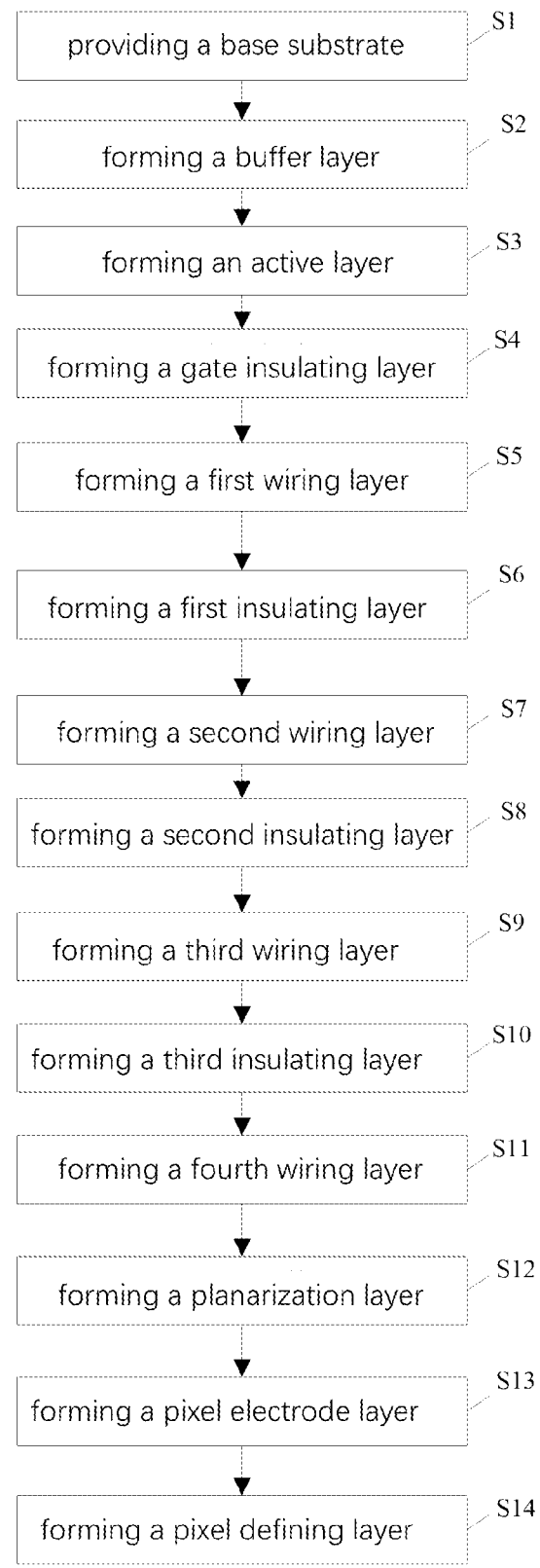
FIG. 3 is a flow chart illustrating a process of manufacturing a display substrate according to an embodiment of the present disclosure.

Referring to FIG. 3, the process of manufacturing the display substrate may include the following steps S1 to S14.

At step S1, a base substrate is provided.
At step S2, a buffer layer is formed.
At step S3, an active layer is formed.
At step S4, a gate insulating layer is formed.
At step S5, a first wiring layer is formed.
At step S6, a first insulating layer is formed.
At step S7, a second wiring layer is formed.
At step S8, a second insulating layer is formed.
At step S9, a third wiring layer is formed.
At step S10, a third insulating layer is formed.
At step S11, a fourth wiring layer is formed.
At step S12, a planarization layer is formed.
At step S13, a pixel electrode layer is formed.
At step S14, a pixel defining layer is formed.

The first reference voltage line Vref and the second reference voltage line Vinit are each for supplying a fixed reference voltage to the pixel circuit, and the influence of the reference voltage supplied by the first reference voltage line Vref on the pixel circuit is larger, and thus the first reference voltage auxiliary line Vref0 is provided in a layer, in which the first reference voltage line Vref and the second reference voltage line Vinit are not provided, among the second wiring layer 7, the third wiring layer 9, and the fourth wiring layer 11, so as to form a network-like coupling relationship with the first reference voltage line Vref, and a resistance of the first reference voltage line Vref is reduced.

Certainly, the number of the via holes H for coupling the first reference voltage line Vref to the first reference voltage auxiliary line Vref0 is at least two.

The first reference voltage line Vref and the second reference voltage line Vinit extend in different directions, one of which is the same as that the gate line Gate adjacent thereto extends in, and the other of which is the same as that the data line Data adjacent thereto extends in, so that the transistors in the pixel circuit are conveniently arranged.

The first reference voltage auxiliary line Vref0 is a newly added line, and thus extends in a direction different from that the first reference voltage line Vref extends in, so that a network-like structure can be formed by the first reference voltage auxiliary line Vref and the first reference voltage line Vref, and an overall resistance can be reduced better.

The via holes H for coupling the first reference auxiliary line Vref0 to the first reference voltage line Vref may be located in a region where the first reference auxiliary line Vref0 and the first reference voltage line Vref overlap. Further referring to FIG. 6g, the first reference voltage auxiliary line Vref0 is electrically coupled to the first reference voltage line Vref through a coupling line Vref1 in the same layer as the first reference voltage auxiliary line Vref0, and then through the via holes H. In such way, a resistance of connection between the first reference voltage auxiliary line Vref0 and the first reference voltage line Vref can be reduced. The coupling line Vref1 extends in the row direction and overlaps the first reference voltage line Vref, so that a wiring space can be saved.

Specifically, orthogonal projections of the coupling line Vref1 and the first reference voltage line Vref on the base substrate 1 may partially overlap with each other, so as to save the wiring space and facilitate the coupling line Vref1 to be electrically coupled to the first reference voltage line Vref through the via hole H.

Figure 6A:
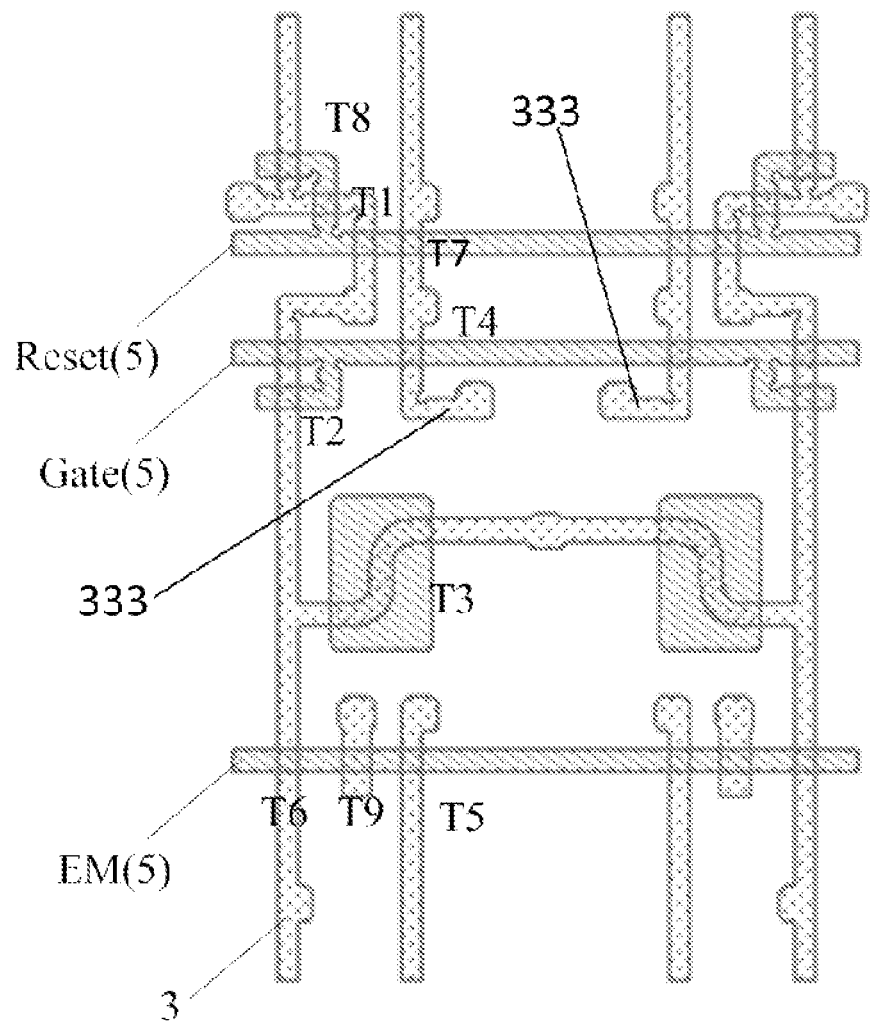
FIGS. 6a to 6h are exploded views of a part of structures in the layout shown in FIG. 4.
Figure 6B:
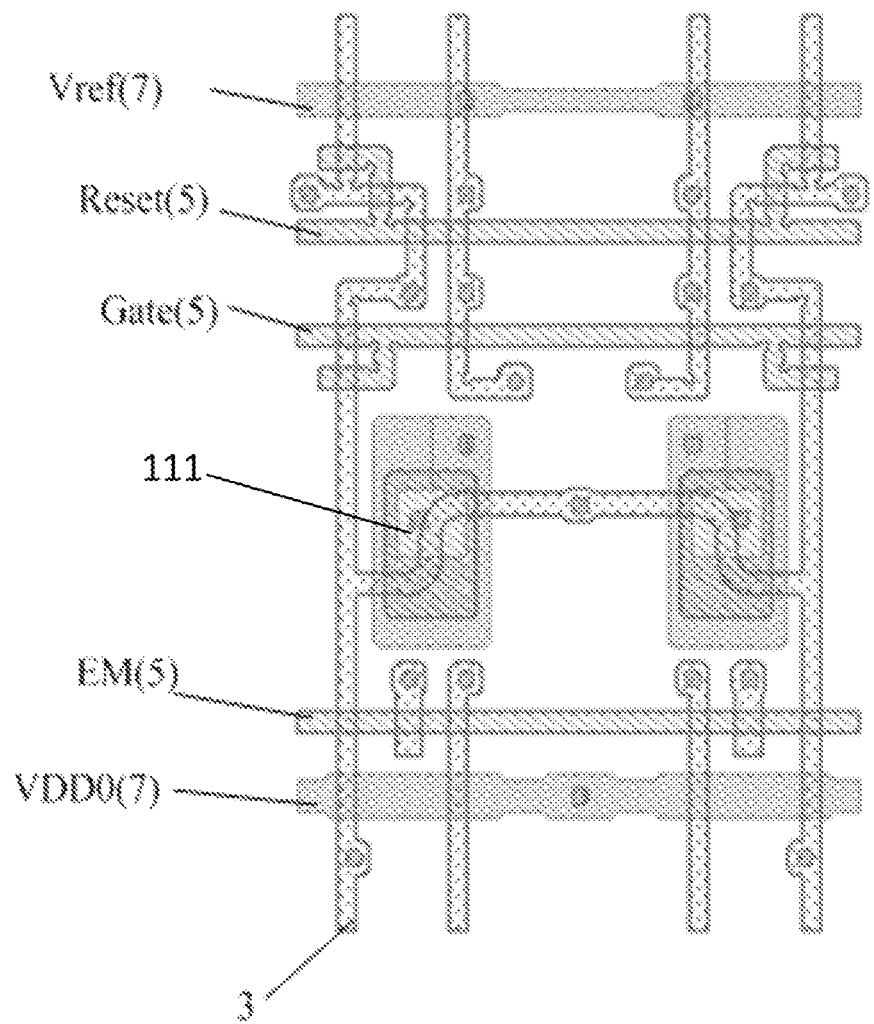
Figure 6C:
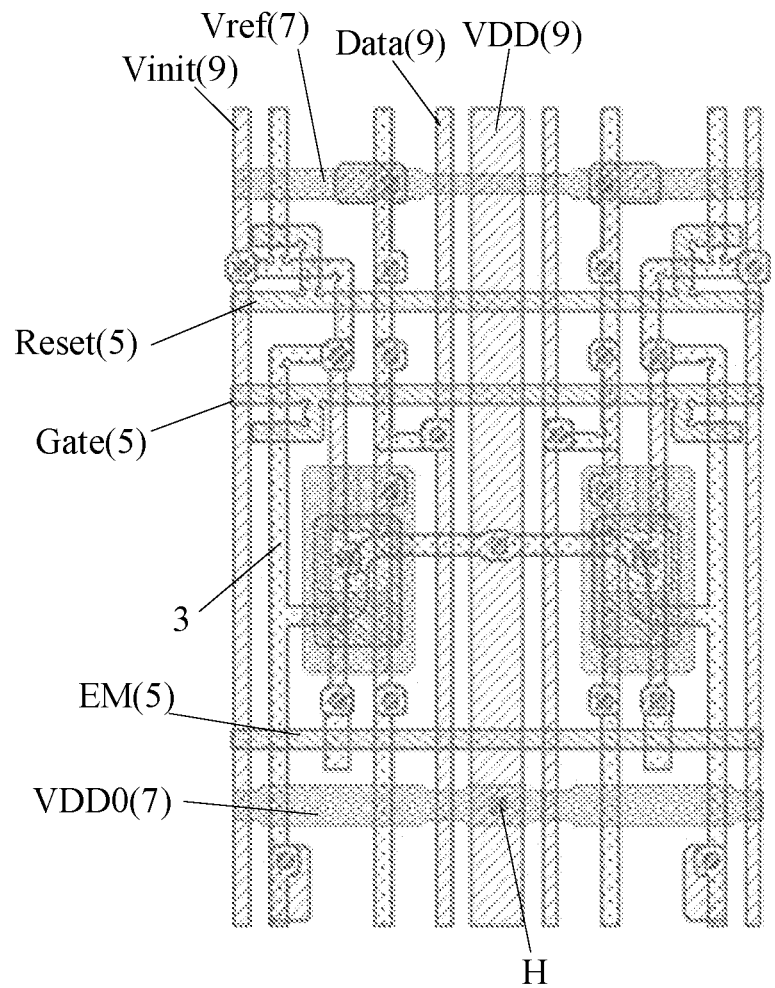
Figure 6D:
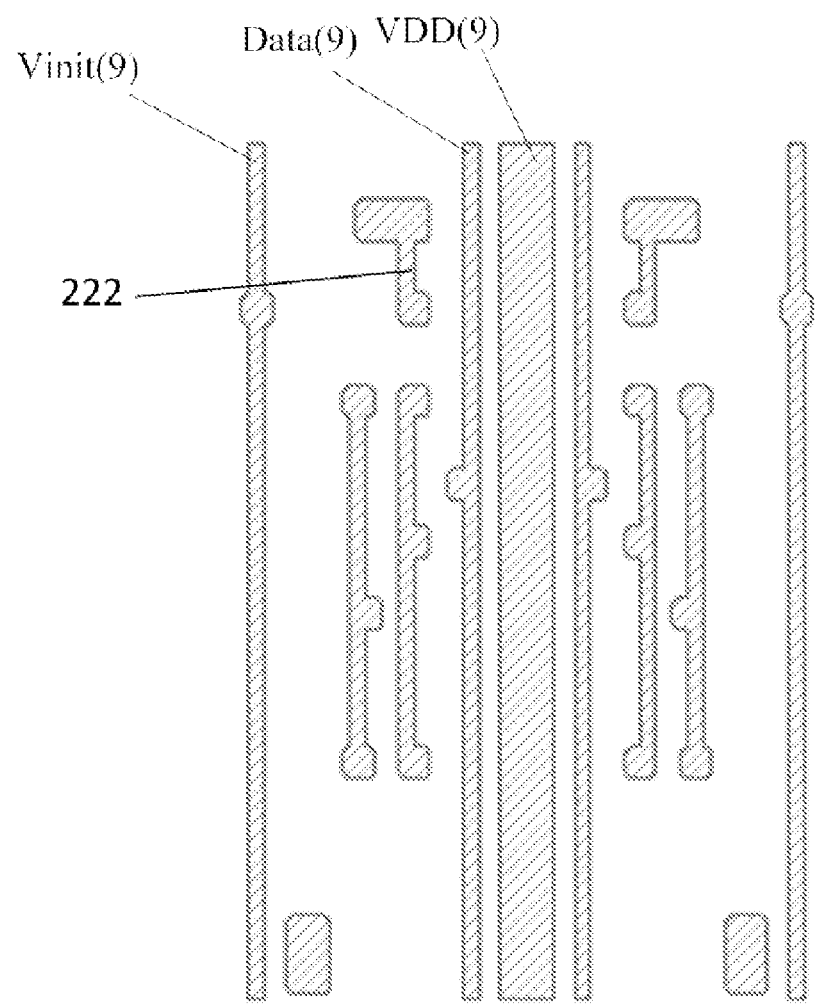
Figure 6E:
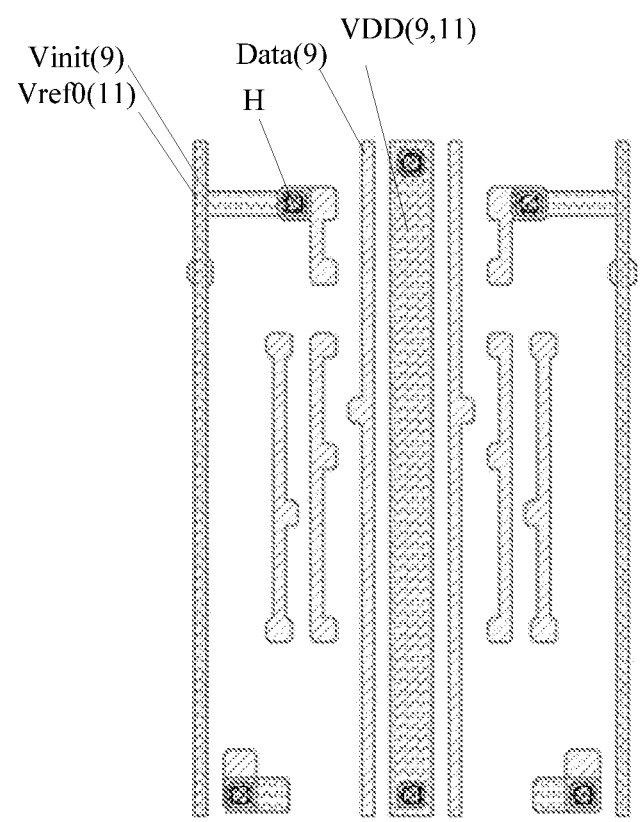
Figure 6F:
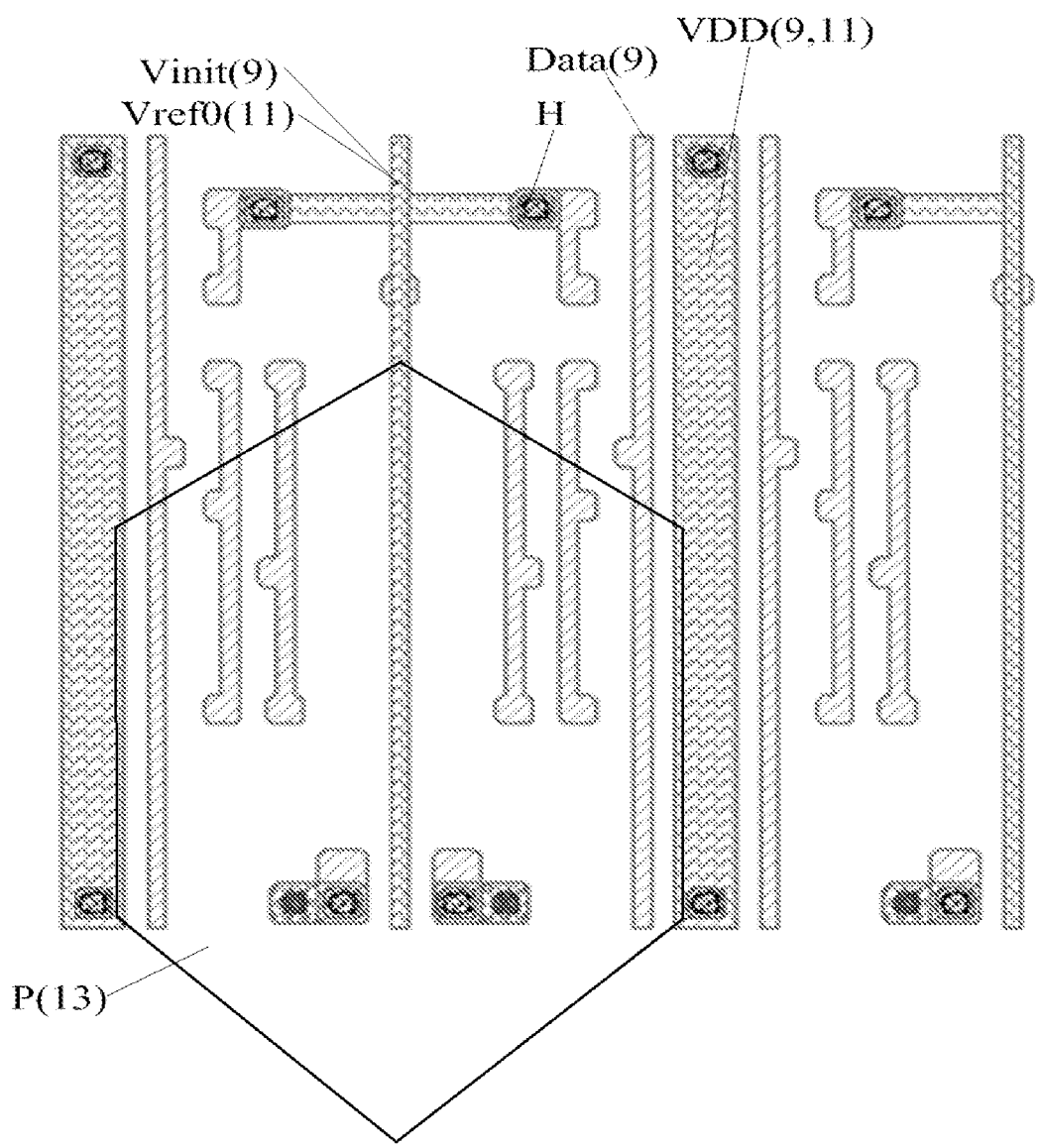
Figure 6G:
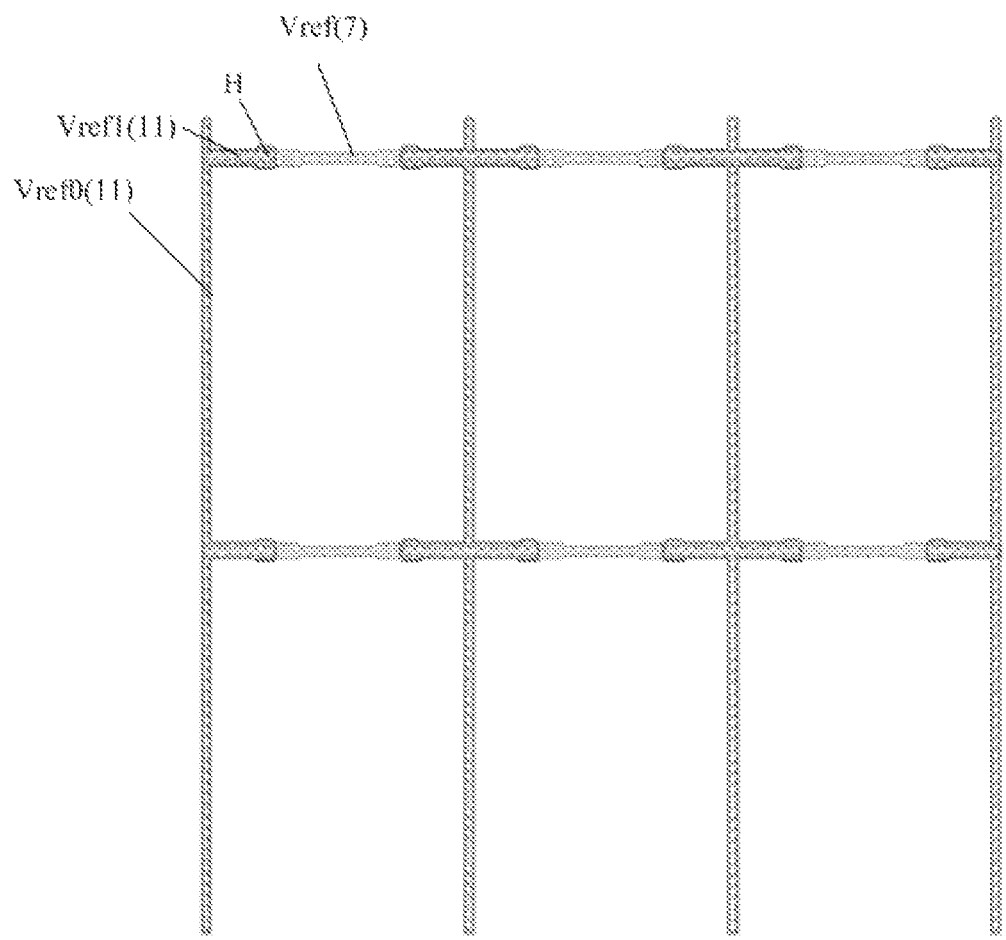
Figure 6H:
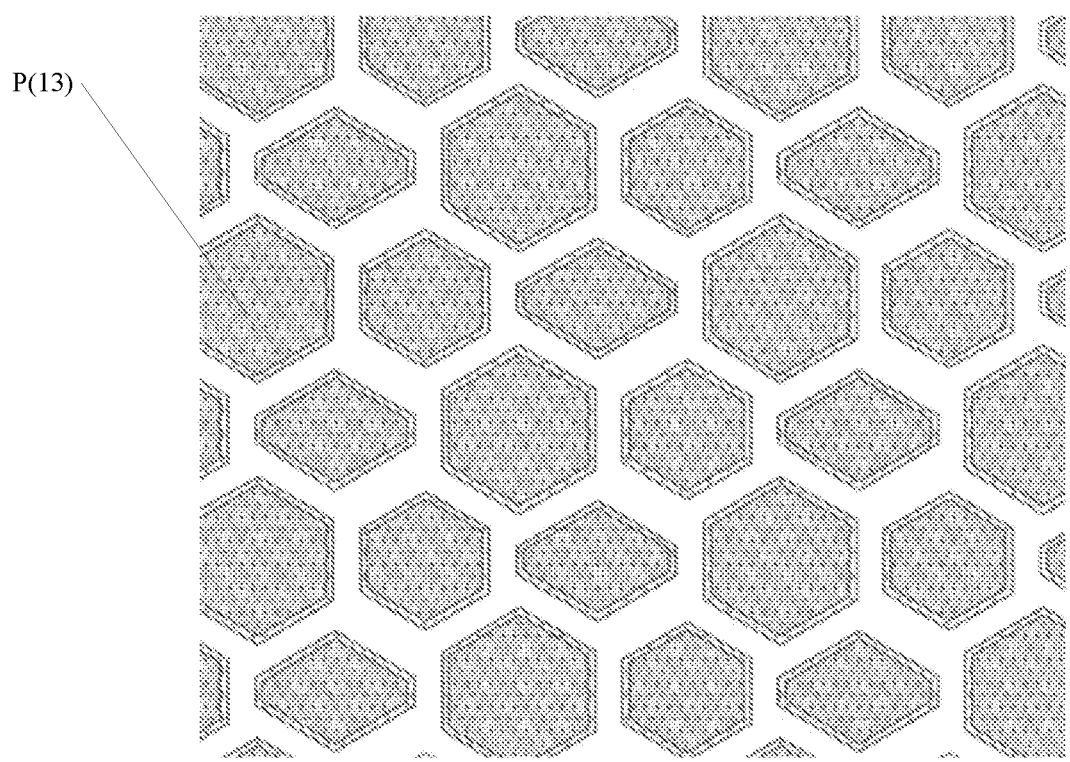

As shown in FIGS. 6g and 6f, between adjacent first reference voltage auxiliary lines Vref0, adjacent coupling lines Vref1 may be disposed at intervals in the direction in which the coupling line Vref1 extends, and may be passed through by a same line extending in the same direction as the coupling line Vref1 (i.e., the adjacent coupling lines Vref1 extend substantially along the same line).

As shown in FIGS. 6e and 6f, a power supply line VDD disposed in the same layer as the coupling line Vref1 may be disposed between the adjacent coupling lines Vref1 arranged at intervals, and a direction in which the power supply line VDD extends intersects with the direction in which the coupling line Vref1 extends.

Such arrangement described above is convenient for wiring and saving the wiring space.

The pixel electrode layer 13 is usually provided with the pixel electrode P, and since no lines need to be arranged in gaps between pixel electrodes P, the pixel electrodes P can be made larger or denser, thereby improving an aperture ratio of the display substrate.

Figure 4:
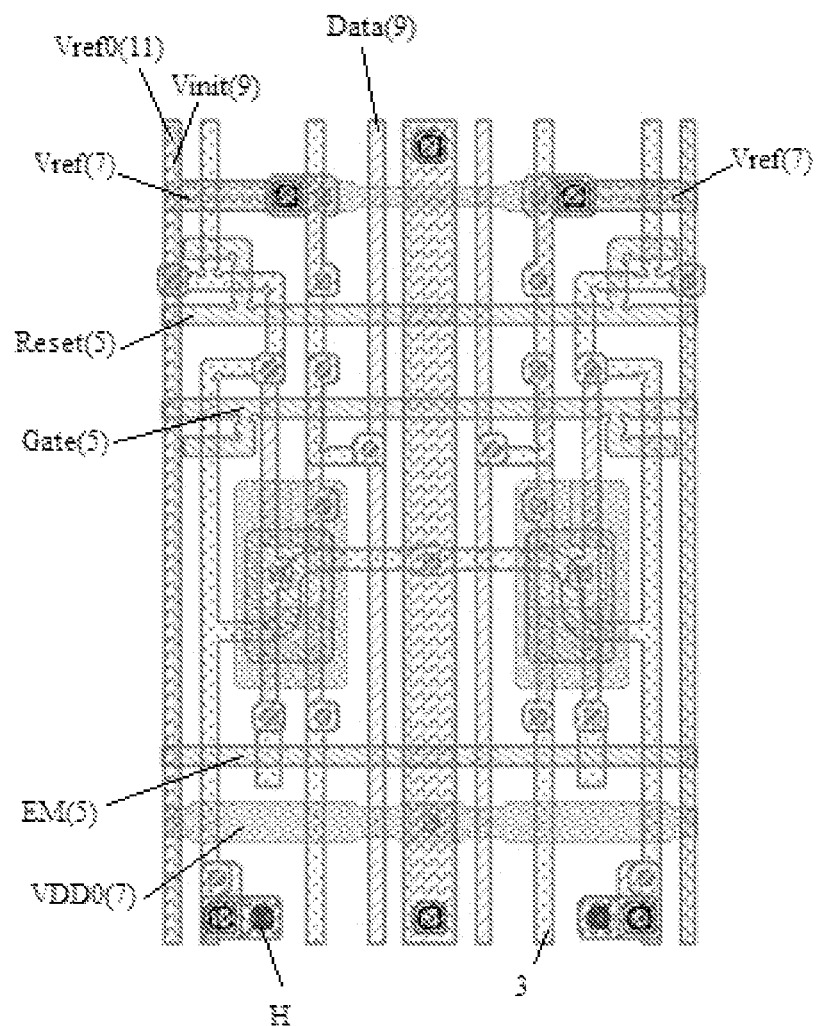
FIG. 4 is a layout of a display substrate according to an embodiment of the present disclosure.

In some embodiments, referring to FIGS. 4 and 5, the first reference voltage line Vref extends in the row direction, and the display substrate further includes a data line Data located in the third wiring layer 9 and extending in the column direction.

The data line Data is located in the third wiring layer 9, and is relatively closer to the transistors to be coupled. The data line Data is generally applied with a varying signal, and is relatively farther away from the pixel electrode P, thereby having less influence on the pixel electrode P.

In some embodiments, the first reference voltage line Vref is located in the second wiring layer 7, and the second reference voltage line Vinit is located in the fourth wiring layer 11.

In this manner, the first reference voltage line Vref in the second wiring layer 7 supplies a first reference voltage to pixel circuits in a same row, and the second reference voltage line Vinit in the fourth wiring layer 11 supplies a second reference voltage to pixel circuits in a same column. Certainly, the first reference voltage auxiliary line Vref0 extends in the column direction and is disposed in the same layer as the data line Data.

In some embodiments, the first reference voltage line Vref is located in the fourth wiring layer 11, and the second reference voltage line Vinit is located in the third wiring layer 9.

In this manner, the first reference voltage line Vref in the fourth wiring layer 11 supplies a first reference voltage to pixel circuits in a same row, and the second reference voltage line Vinit in the third wiring layer 9 supplies a second reference voltage to pixel circuits in a same column. Certainly, the first reference voltage auxiliary line extends in the column direction. At this time, the data line Data is located in the third wiring layer 9, and extends in a direction the same as that the second reference voltage line Vinit extends in.

In some embodiments, referring to FIGS. 4 and 5, the first reference voltage line Vref is located in the second wiring layer 7, and the second reference voltage line Vinit is located in the third wiring layer 9.

The numbers in parentheses in FIG. 4 and FIGS. 6a to 6f indicate the layer structures in which the structures are located. For example, P(13) indicates that the pixel electrode P is located in the pixel electrode layer 13.

In this manner, the first reference voltage line Vref in the second wiring layer 7 supplies a first reference voltage to pixel circuits in a same row, and the second reference voltage line Vinit in the third wiring layer 9 supplies a second reference voltage to pixel circuits in a same column. Certainly, the first reference voltage auxiliary line Vref0 extends in the column direction and is located in the fourth wiring layer 11.

In some embodiments, referring to FIGS. 4 and 5, the display substrate further includes a power supply line VDD located in the third wiring layer 9 and extending in the column direction, and a power supply auxiliary line VDD0 located in the second wiring layer 7 and extending in the row direction, and the power supply line VDD and the power supply auxiliary line VDD0 are electrically coupled through a via hole H penetrating through the insulating layer therebetween.

The power supply line VDD in the third wiring layer 9 supplies a power supply voltage to pixel circuits in a same column. The power auxiliary line VDD0 in the second wiring layer 7 is coupled to the power supply line VDD to form a network-like structure, which is beneficial to reducing the resistance of the power supply line VDD and improving consistency of power voltages provided by power supply lines VDD for pixel circuits.

In practices, the power supply line VDD in the third wiring layer 9 may be block structures arranged at intervals in the column direction, also referred to as power supply structures, and such arrangement may facilitate an arrangement of other structures in the third wiring layer 9.

Certainly, referring to FIG. 6e, the power supply line VDD extending in the column direction may be further provided in the fourth wiring layer 11. The power supply line VDD in the fourth wiring layer 11 and the power supply line VDD (i.e., power supply structures) in the third wiring layer 9 are electrically coupled through via holes H, thereby further reducing the resistance of the power supply line VDD and improving uniformity of voltages supplied by power supply lines VDD.

An orthographic projection of the power supply line VDD (i.e., power supply structures) in the third wiring layer 9 on the base substrate 1 may overlap with an orthographic projection of the power supply line VDD in the fourth wiring layer 11 on the base substrate 1, so as to save the wiring space without affecting an aperture ratio of the display substrate.

In some embodiments, the display substrate further includes pixel circuits arranged in the row direction and the column direction, the pixel circuits in each row is electrically coupled to one gate line Gate, one reset control line Reset and one light emitting control line EM, and the pixel circuits in each column is electrically coupled to one data line Data and one power supply line VDD.

Referring to FIG. 4 and FIGS. 6a to 6c, the pixel circuit is generally composed of transistors, a capacitor, and the like. It is easily understood that the transistor may be formed near a region where the active layer 3 overlaps the gate line Gate, the reset control line Reset, and the light emitting control line EM (all of which are located in the first wiring layer 5) in the layout.

With continued reference to FIG. 4 and FIGS. 6a to 6e, for ease of arrangement and saving space, the pixel circuits adjacent to each other in a same row may be symmetrically disposed with respect to an axis of symmetry extending in the column direction.

Further, data lines Data to which the pixel circuits adjacent to each other in the same row are electrically coupled may be symmetrically disposed with respect to an axis of symmetry extending in the column direction, and the power supply lines VDD to which the pixel circuits adjacent to each other in the same row are electrically coupled may be symmetrically disposed with respect to an axis of symmetry extending in the column direction, so as to keep an electrical environment uniform.

In practices, the pixel circuits adjacent to each other in the same row may share the power supply line VDD (i.e., power supply structures) disposed in the third wiring layer 9.

In some embodiments, referring to FIGS. 1 and 4, each pixel circuit includes a first transistor T1, a second transistor T2, a third transistor T3, a fourth transistor T4, a fifth transistor T5, a sixth transistor T6, a seventh transistor T7, an eighth transistor T8, a ninth transistor T9, and a first capacitor C1, each of a gate of the first transistor T1 and a gate of the seventh transistor T7 is electrically coupled to the reset control line Reset corresponding thereto, each of a first electrode of the first transistor T1 and a first electrode of the eighth transistor T8 is electrically coupled to the second reference voltage line Vinit corresponding thereto, a second electrode of the first transistor T1 is electrically coupled to a first electrode of the ninth transistor T9, a second electrode of the ninth transistor T9, a first electrode of the second transistor T2, a gate of the third transistor T3 and a second electrode of the first capacitor C1, a second electrode of the eighth transistor T8 is electrically coupled to the pixel electrode P and a first electrode of the sixth transistor T6, each of a gate of the sixth transistor T6, a gate of the ninth transistor T9, and a gate of the fifth transistor T5 is electrically coupled to the light emitting control line EM corresponding thereto, a second electrode of the sixth transistor T6 is electrically coupled to a second electrode of the second transistor T2 and a first electrode of the third transistor T3, a second electrode of the third transistor T3 is electrically coupled to the power supply line VDD corresponding thereto, each of a gate of the second transistor T2 and a gate of the fourth transistor T4 is electrically coupled to the gate line Gate corresponding thereto, a first electrode of the fourth transistor T4 is electrically coupled to the data line Data corresponding thereto, a second electrode of the fourth transistor T4 is electrically coupled to a first electrode of the first capacitor C1, a first electrode of the fifth transistor T5 and a first electrode of the seventh transistor T7, and each of a second electrode of the fifth transistor T5 and a second electrode of the seventh transistor T7 is electrically coupled to the first reference voltage line Vref corresponding thereto.

The above pixel circuit is also referred to as a 9T1C pixel circuit. The coupling relationship between the components in the pixel circuit is not limited to above. As long as the pixel circuit needs to be controlled by the gate line Gate, the data line Data, the power supply line VDD, the reset control line Reset, the light emitting control line EM, the first reference voltage line Vref, and the second reference voltage line Vinit, the present disclosure is applicable.

In the above embodiments, the transistors being top gate type thin film transistors is taken as an example, and the active layer 3 is located on a side of the first wiring layer 5 facing the base substrate 1.

Certainly, the transistors in the above embodiment may be bottom gate type thin film transistors, and then the first wiring layer 5, the active layer 3, the second wiring layer 7, the third wiring layer 9, and the fourth wiring layer 11 may be successively arranged in a direction away from the base substrate 1, which is also applicable to the technical solutions of the present disclosure.

For ease of arrangement and saving space, the pixel circuits adjacent to each other in the same row may be coupled together by respective active layers 3 thereof, for example, referring to FIG. 6a, the pixel circuits adjacent to each other in the same row may be coupled together by the active layers 3 of respective driving transistors (i.e., third transistors T3) thereof.

Referring to FIGS. 6a and 6b, a first electrode (i.e., the active layer 3) of a compensation transistor (i.e., the second transistor T2) and a gate electrode (in the first wiring layer 5) of the driving transistor (i.e., the third transistor T3) of the pixel circuit may be coupled together through a first connection block 111 on a side of the second wiring layer 7 away from the base substrate 1.

In order to keep an electrical environment uniform, referring to FIG. 6b, first connection blocks 111 of the pixel circuits adjacent to each other in the same row may be symmetrically disposed with respect to an axis of symmetry extending in the column direction.

Referring to FIGS. 6a to 6d, a second electrode (i.e., the active layer 3) of a reset control transistor (i.e., the seventh transistor T7) of the pixel circuit may be coupled to the first reference voltage line Vref through a second connection block 222 disposed on a side of the second wiring layer 7 away from the base substrate 1 (e.g., disposed in the third wiring layer 9) and extending longitudinally (i.e., in the column direction). Such arrangement may be regarded as increasing a length of the first reference voltage line Vref to reduce the resistance thereof.

With continued reference to FIGS. 6a to 6c, parts of data writing transistors (i.e., fourth transistors T4) of the pixel circuits adjacent to each other in the same row in the active layer 3 include portions 333 extending towards each other in the row direction, and the portions 333 extending towards each other in the row direction are electrically coupled to the data lines Data through via holes, respectively.

In such way, the data lines Data coupled to the pixel circuits adjacent to each other in the same row are arranged between the pixel circuits adjacent to each other, and thus the space can be further saved.

With continued reference to FIG. 6a, an orthographic projection of the active layer 3 of a reset transistor (i.e., the first transistor T1) of the pixel circuit on the base substrate 1 overlaps with an orthographic projection of the reset control line Reset on the base substrate 1 at two positions, so that the reset transistor of the pixel circuit is in a double-gate structure, which can improve a capability of cutting off current flowing there-through.

Referring to FIGS. 1 and 6f, each pixel circuit includes a light emitting device LED, an electrode (e.g., an anode) of the light emitting device LED may be the pixel electrode P in the pixel electrode layer 13, orthographic projections of the pixel electrode P and the first reference voltage auxiliary line Vref0 on the base substrate 1 partially overlaps with each other, and an orthographic projection of a bisector of the pixel electrode P in the row direction on the base substrate 1 at least partially overlaps with the orthographic projection of the first reference voltage auxiliary line Vref0 on the base substrate 1.

In order to maintain flatness of the pixel electrode P, an orthogonal projection of the pixel electrode P on the base substrate 1 may at least partially overlap with orthogonal projections of two adjacent power supply lines VDD on the base substrate 1.

The layout of the pixel circuit is not particularly limited by the present disclosure, and for example, the first capacitor C1 formed by which two layer structures may be flexible.

Figure 2:
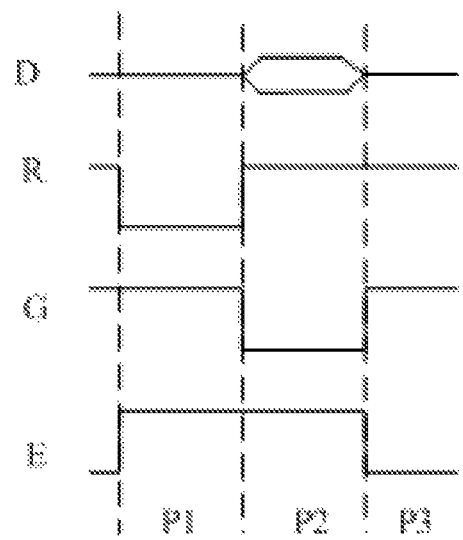
FIG. 2 is a timing diagram of a pixel circuit in a display substrate according to an embodiment of the present disclosure.

Referring to FIG. 2, a driving timing of the pixel circuit is as follows.

A signal supplied to the gate line Gate is denoted by G, a signal supplied to the reset control line Reset is denoted by R, a signal supplied to the light emitting control line EM is denoted by E, and a signal supplied to the data line Data is denoted by D. The signal supplied to the gate line Gate, the signal supplied to the reset control line Reset, and the signal supplied to the light emitting control line EM are all exemplified by taking a low voltage signal as an active signal.

In a first phase P1, an active voltage is supplied to the reset control line Reset, and an inactive voltage is supplied to each of the gate line Gate and the light emitting control line EM. At this time, a voltage at the first node N1 is the first reference voltage V1, and a voltage at the second node N2 is the second reference voltage V2.

In a second phase P2, an active voltage is applied to the gate line Gate, an inactive voltage is applied to each of the reset control line Reset and the light emitting control line EM, and a data voltage is applied to the data line Data, a data voltage Vdata is written to the first node N1, and a voltage at the second node N2 is V3+Vth, where V3 is a voltage applied to the power supply line VDD and Vth is a threshold voltage of the third transistor T3.

In a third phase P3, an active voltage is supplied to the light emitting control line EM, and an inactive voltage is supplied to each of the reset control line Reset and the gate line Gate. At this time, the voltage at the first node N1 becomes the first reference voltage V1, and the voltage at the second node N2 becomes V3+Vth+V1−VData.

In the third stage P3, the light emitting device LED emits light.

The current flowing through the light emitting device LED is: $I=k(V1-Vdata)^2$, where k is a proportionality coefficient.

In this manner, the current in the light emitting device LED driven by the pixel circuit is independent of the threshold voltage of the third transistor T3 itself, thereby improving uniformity of driving for displaying.

In some embodiments, referring to FIG. 4, orthographic projections of the second reference voltage line Vinit and the first reference voltage auxiliary line Vref0 on the base substrate 1 overlap each other.

Since both the second reference voltage line Vinit and the first reference voltage auxiliary line Vref0 are applied with a direct current, even if there is a parasitic capacitance therebetween, the influence on signals of them is weak. Furthermore, a wiring space of the layout can be saved, and a display resolution ratio can be improved.

In some embodiments, the display substrate further includes a light emitting device LED, and an electrode of the light emitting device LED is the pixel electrode P in the pixel electrode layer 13.

Specifically, the light emitting device LED is an organic light emitting diode or a quantum dot light emitting diode.

Taking an organic light emitting diode as the light emitting device LED as an example, the pixel electrode P, the organic light emitting layer, and a cathode (the cathode is coupled to a cathode power supply line VSS) are sucessively arranged in a direction away from the base substrate 1.

An embodiment of the present disclosure further provides a display device, which includes the display substrate described above.

The display device is, for example, any product or component having a display function, such as an organic light emitting diode display panel, a quantum dot light emitting diode display panel, an organic light emitting diode display module, a mobile phone, a display, a tablet computer, and the like.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the present disclosure, and these changes and modifications are to be considered within the scope of the present disclosure.

The invention claimed is:

1. A display substrate, comprising: a base substrate, and a first wiring layer, a second wiring layer, a third wiring layer, a fourth wiring layer and a pixel electrode layer successively away from the base substrate, an insulating layer is disposed between any adjacent ones of the first wiring layer, the second wiring layer, the third wiring layer, the fourth wiring layer and the pixel electrode layer, a reset control line and a light emitting control line, which each extend in a row direction, are disposed in the first wiring layer, the display substrate further comprises a first reference voltage line, a second reference voltage line, and a first reference voltage auxiliary line, the first reference voltage line and the first reference voltage auxiliary line are respectively disposed in one of the second wiring layer, the third wiring layer, and the fourth wiring layer, the first reference voltage line and the first reference voltage auxiliary line extend in different directions, the second reference voltage line and the first reference voltage auxiliary line extend in a same direction, the first reference voltage auxiliary line is electrically coupled to the first reference voltage line through a plurality of via holes penetrating through the insulating layer between a layer where the first reference voltage auxiliary line is disposed and a layer where the first reference voltage line is disposed, via a coupling line extending in the same direction as the first reference voltage line, the display substrate further comprises a first capacitor, the first reference voltage auxiliary line and the first reference voltage line are configured to provide a reset voltage to a first electrode of the first capacitor, and the second reference voltage line is configured to provide a reset voltage to a pixel electrode in the pixel electrode layer.

2. The display substrate according to claim 1, wherein the first reference voltage auxiliary line is disposed in the same layer as the coupling line, and orthogonal projections of the coupling line and the first reference voltage line on the base substrate partially overlap with each other.

3. The display substrate according to claim 1, wherein adjacent coupling lines between adjacent first reference voltage auxiliary lines are disposed at intervals in the direction in which the coupling line extends, and are passed through by a same line extending and in the same direction as the coupling line, and a power supply line is disposed between the adjacent coupling lines in the same layer as the coupling lines, and a direction in which the power supply line extends intersects with the direction in which the coupling line extends.

4. The display substrate according to claim 1, wherein the first reference voltage line extends in the row direction, and is disposed in the second wiring layer, and the first reference voltage auxiliary line extends in a column direction, and is disposed in the fourth wiring layer.

5. The display substrate according to claim 4, further comprising: a power supply structure, and a power supply auxiliary line disposed in the second wiring layer and extending in the row direction, the power supply structure is electrically coupled to the power supply auxiliary line through a plurality of via holes penetrating through the insulating layer between the second wiring layer and a layer where the power supply structure is located.

6. The display substrate according to claim 5, further comprising:
a power supply line disposed on a side of the power supply structure away from the base substrate and extending in the column direction, and the power supply structure is electrically coupled to the power supply line through a plurality of via holes penetrating through the insulating layer between the layer where the power supply structure is disposed and a layer where the power supply line is disposed.

7. The display substrate according to claim 6, wherein orthographic projections of the power supply structure and the power supply line on the base substrate overlap with each other.

8. The display substrate according to claim 6, further comprising: data lines each extending in the column direction and pixel circuits arranged in the row direction and the column direction, the pixel circuits in each row are correspondingly and electrically coupled to a gate line, the reset control line and the light emitting control line, and the pixel circuits in each column are correspondingly and electrically coupled to one data line and one power supply line.

9. The display substrate according to claim 8, wherein the pixel circuits adjacent to each other in a same row are disposed symmetrically with respect to an axis of symmetry extending in the column direction.

10. The display substrate according to claim 8, wherein the data lines to which the pixel circuits adjacent to each other in the same row are electrically coupled are symmetrically disposed with respect to an axis of symmetry extending in the column direction, and power supply lines to which the pixel circuits adjacent to each other in the same row are electrically coupled are symmetrically disposed with respect to an axis of symmetry extending in the column direction.

11. The display substrate according to claim 8, wherein the pixel circuits adjacent to each other in the same row share the power supply structure.

12. The display substrate according to claim 8, wherein the pixel circuits adjacent to each other in the same row are coupled together by respective active layers thereof.

13. The display substrate according to claim 8, wherein each pixel circuit comprises a compensation transistor and a driving transistor, and a first electrode of the compensation transistor and a gate electrode of the driving transistor are coupled together by a first connection block disposed on a side of the second wiring layer away from the base substrate.

14. The display substrate according to claim 13, wherein first connection blocks of the pixel circuits adjacent to each other in the same row are disposed symmetrically with respect to an axis of symmetry extending in the column direction.

15. The display substrate according to claim 8, wherein each pixel circuit comprises a reset control transistor, and the first reference voltage line is coupled to a second electrode of the reset control transistor through a second connection block disposed on a side of the second wiring layer away from the base substrate and extending in the column direction.

16. The display substrate according to claim 8, wherein each pixel circuit comprises a data writing transistor, and parts of data writing transistors of the pixel circuits adjacent to each other in the same row in an active layer, comprise portions extending towards each other in the row direction, and the portions extending towards each other in the row direction are electrically coupled to the data lines through via holes, respectively.

17. The display substrate according to claim 8, wherein each pixel circuit comprises a reset transistor, and orthographic projections of an active layer of the reset transistor and the reset control line on the base substrate overlap with each other at two positions, so that the reset transistor is in a double-gate structure.

18. The display substrate according to claim 8, wherein each pixel circuit comprises a light emitting device, an electrode of the light emitting device is the pixel electrode in the pixel electrode layer, orthographic projections of the pixel electrode and the first reference voltage auxiliary line on the base substrate overlap with each other, and an orthogonal projection of a bisector of the pixel electrode in the row direction on the base substrate at least partially overlaps with an orthogonal projection of the first reference voltage auxiliary line on the base substrate.

19. The display substrate according to claim 8, wherein each pixel circuit comprises a light emitting device, an electrode of the light emitting device is the pixel electrode in the pixel electrode layer, and an orthogonal projection of the pixel electrode on the base substrate at least partially overlaps with orthogonal projections of two adjacent power supply lines on the base substrate.

20. A display device, comprising the display substrate according to claim 1.

* * * * *